WAVE SIGNAL APPARATUS

Filed March 1, 1963

INVENTOR.
Ernest W. Reinwall, Jr.,
BY
Mueller & Aichele

United States Patent Office 3,175,407
Patented Mar. 30, 1965

3,175,407
WAVE SIGNAL APPARATUS

Ernest W. Reinwall, Jr., McHenry, Ill., assignor to Motorola, Inc., Franklin Park, Ill., a corporation of Illinois Filed Mar. 1, 1963, Ser. No. 262,033
3 Claims. (Cl. 74—10.8)

This invention relates to tuner mechanisms for television receivers, and more particularly to a preset fine tuning system for such a tuner mechanism.

Television tuners, and especially automatic tuners, often incorporate the feature of preset fine tuning in the tuner mechanism. This enables the customer to preset the fine tuning for each channel and then merely turn the channel selector, either manually or automatically, to bring in a clear, properly tuned signal. In such tuners it is desirable to have some means for adjusting the fine tuning for each channel which is readily accessible to the user and simple to operate. Tuners have been constructed wherein the fine tuning may be preset by a separate fine tuning knob, but this knob usually had to be pushed, pulled, or otherwise manipulated to engage the fine tuning mechanism.

Accordingly, it is an object of this invention to provide an improved preset fine tuning mechanism which is relatively simple to operate.

Another object of the invention is to provide a preset fine tuning mechanism for a channel selector tuner which is low in cost and reliable of operation.

A further object of the invention is to provide a preset fine tuning mechanism for wafer type tuners wherein engagement of the fine tuning adjusting member occurs coincident with the tuning of the fine tuning knob.

A feature of the invention is the provision of a preset fine tuner mechanism for a wafer type tuner incorporating an axially pivotal idler displaceable by tuning the fine tuning shaft to cause the idler to engage directly with the fine tuning screws.

A further feature of the invention is the provision of a preset fine tuner mechanism for a wafer type tuner, wherein rotation of the fine tuning sleeve actuates a camming action in addition to causing rotation of an adjusting idler, which camming action moves the idler into engagement with the fine tuning screw to be adjusted.

Figures 1, 2, 3:
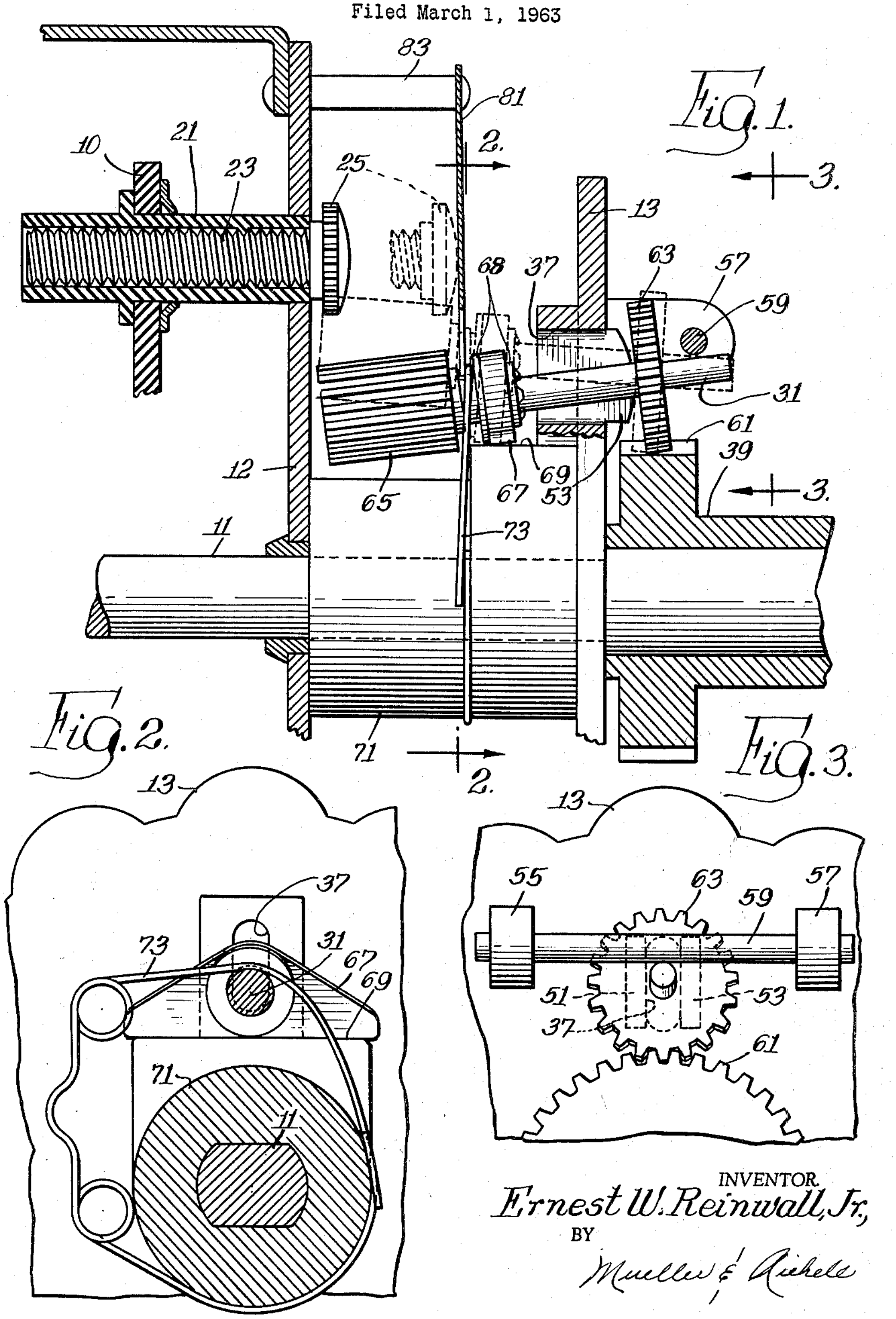
FIG. 1, is a half sectional view of a wafer type tuner mechanism constructed in accordance with the invention.
FIG. 2, is a sectional view taken along the lines 2—2 of FIG. 1.
FIG. 3, is a sectional view taken along the line 3—3 of FIG. 1.

The invention provides an improved fine tuning device for a television tuner of the channel selector type, having a rotatable channel selector shaft and a plurality of separate tuning elements for tuning television signals of different predetermined frequencies in a given frequency range. A fine tuning sleeve is rotatably supported in coaxial relation on the selector shaft, and a plurality of independently adjustable fine tuning screws for fine adjustment of the various predetermined frequencies represented by the tuning elements, are mounted in circular array about the selector shaft. An axially pivotable, rotatable idler is mounted such that it is adjacent the circular array of fine tuning screws. The idler is mounted on a wheel driven by the selector shaft. In the wafer type tuner shown, the screws remain stationary and the idler rotates with the selector shaft. Rotation of the selector shaft serves to position the idler adjacent the proper screw. A gear on the fine tuning sleeve is constantly in engagement with the idler and when the fine tuning sleeve is turned, a cam displaces the idler into engagement with the adjacent fine tuning screw. Thus the fine tuning knob on the fine tuning sleeve is turned to cause engagement of the idler and a fine tuning screw. Further turning after engagement results in turning the fine tuning screw and the desired result is attained.

Referring now to FIGS. 1 through 3, the fine tuning mechanism of the invention is shown. A wafer type tuner is generally characterized by a plurality of stationary wafers carrying the various circuit elements of the tuner, as is well known in the art. Contacts (not shown) fixed on the wafers 10 are controlled by rotation of a tuner control shaft 11 extending through the front plate 12 of the tuner. Positioning of control shaft 11 is accomplished by means of a detent wheel 13 which may be engaged by a spring biased detent arm, not shown, as is well known in the art. This wheel 13 serves to position the selector shaft 11 for each channel over the frequency range of the tuner.

Within the particular channel position, means are provided for fine tuning the tuner to maintain a clear, sharp signal. In the tuner shown, this is accomplished by means of a plurality of oscillator coils 21 disposed circularly about the selector shaft 11. Each of oscillator coils 21 contains a screw 23 for varying the inductance thereof. Each of screws 23 is provided with a gear head 25 to facilitate adjustment which will be explained, and each screw is adjustable to fine tune the particular channel it represents. Accordingly, the position of a particular screw may be varied to preset the fine tuning for each channel of the tuner.

Fine tuning sleeve 39 is always freely rotatable on selector shaft 11, and a control knob may be attached to each, one for fine tuning sleeve 39 and one for operating selector shaft 11. Detent wheel 13 is provided with an opening 37 therein. Idler shaft 31 is captured between two projections 51 and 53 fixed to detent wheel 13. Two other projections 55 and 57 extend from detent wheel 13 and contain a stop bar 59 which engages one end of idler shaft 31 when the fine tuning mechanism is not being used. A drive gear 61 is fixed to the fine tuning sleeve 39 and engages a gear 63 at one end of idler shaft 31. A second gear 65 on idler shaft 31 is mounted at the opposite end. Intermediate gears 63 and 65 is a cam member 67, also fixed to idler shaft 31. Cam member 67 bears on a bearing surface 69 on a generally cylindrical extension 71 of detent wheel 13. Extension 71 and detent wheel 13 are keyed to selector shaft 11 and rotate therewith to align gear 65 adjacent the desired one of fine tuning screws 23.

When it is desired to fine tune the adjacent one of screws 23, fine tuning sleeve 39 is turned, causing gear 61 thereon which engages gear 63 to rotate the idler shaft 31. Cam 67 is frictionally mounted on idler shaft 31 by means of friction washers 68. As sleeve 39 is turned, cam 67 bears against the surface 69, displacing the gear 65 upwardly and hence moving the idler shaft 31 into the position shown in phantom in FIG. 1. As may be seen from the drawing, this movement is essentially pivotal even though idler shaft 31 has no fixed pivot but instead floats in opening 37. The pivotal motion is due to the arrangement of cam 67 and gear 63. When idler shaft 31 is pivoted, gear 65 will engage the gear head 25 of screw 23, permitting adjustment thereof as fine tuning sleeve 39 is turned still further and idler shaft 31 turns within cam 67 as the frictional engagement therebetween is overcome. The movement of screw 23 is indicated in phantom. When sleeve 39 is released, a spring 73 surrounding both idler shaft 31 and extension 71, returns the idler shaft 31 to its original position. This allows gear 65 to clear gear heads 25 when coarse channel tuning of the mechanism is taking place. Overtravel of screws 23 is prevented by a stop ring 81 mounted on posts 83 to engage the gear heads 25.

Accordingly, the invention provides an improved preset fine tuning mechanism which is low in cost and reliable of operation. The operation is greatly simplified by using a cam arrangement on a wafer type tuner wherein the control knob is merely turned to permit presetting of the fine tuning.

I claim:

1. A fine tuning device for a television tuner of the wafer switch type having a rotatable selector shaft and a plurality of separate tuning elements individually associated with the channels to be selected, and which elements provide tuning of television signals of different predetermined frequencies in a given frequency range, said device including in combination, a fine tuning shaft rotatably supported in coaxial relation with the selector shaft, a plurality of independently adjustable fine tuning screws individually associated with the tuning elements for fine tuning the same and arrayed circularly in fixed position about the selector shaft, pivotal idler means positioned adjacent the circular array of said fine tuning screws and offset radially from both said fine tuning screws and said fine tuning shaft, support means on the selector shaft and carrying said idler means, said support means being rotatable by said selector shaft to position said idler means adjacent said fine tuning screw associated with the particular tuning element for the channel selected, gear means coupling said fine tuning shaft with said idler means, and cam means actuable upon rotation of said idler means to pivot said idler means into engagement with the adjacent one of said fine tuning screws, said gear means being operable by rotating said fine tuning shaft to rotate said idler means and thereby adjust the fine tuning screw engaging the same, whereby fine tuning for each channel of the channel selector may be preset.

2. A fine tuning device for a television tuner of the wafer switch type having a rotatable selector shaft and a plurality of separate tuning elements individually associated with the channels to be selected and which elements provide tuning of television signals of different predetermined frequencies in a given frequency range, said device including in combination, a fine tuning sleeve rotatably supported in coaxial relation on the selector shaft, a plurality of independently adjustable gear head fine tuning screws individually associated with the tuning elements for fine tuning the same and arrayed in fixed position circularly about the selector shaft, a pivotal common axis double gear idler with one gear thereof positioned adjacent the circular array of said fine tuning screws, said idler being offset radially from both said fine tuning screws and said fine tuning sleeve, support means on the selector shaft and supporting said idler, said support means being rotatable by said selector shaft to position said one gear of said idler adjacent said fine tuning screw associated with the particular tuning element for the channel selected, gear means coupling said fine tuning sleeve with the other gear of said idler, and camming means actuable by movement of said fine tuning sleeve to pivot said idler and bring said one gear of said idler into engagement with the gear head of the adjacent one of said fine tuning screws, said gear means being operable by rotating said fine tuning sleeve to rotate said idler and thereby adjust the fine tuning screw engaging same, whereby fine tuning for each channel of the channel selector may be preset.

3. A fine tuning device for a television tuner of the wafer switch type having a rotatable selector shaft and a plurality of separate tuning elements individually associated with the channels to be selected and which elements provide tuning of television signals of different predetermined frequencies in a given frequency range, said device including in combination, a fine tuning sleeve rotatably supported in coaxial relation on the selector shaft, a plurality of independently adjustable gear head fine tuning screws individually associated with the tuning elements for fine tuning the same and arrayed in fixed position circularly about the selector shaft, a pivotal idler shaft having a first gear at one end positioned adjacent to the circular array of said fine tuning screws, said idler shaft being offset radially from both said fine tuning screws and said fine tuning sleeve, said idler shaft having a second gear at the other end thereof, a detent positioning wheel on the selector shaft supporting said idler shaft, said positioning wheel being rotatable by the selector shaft to position said first gear adjacent said fine tuning screw associated with the particular tuning element for the channel selected, a drive gear fixed to said fine tuning sleeve and engaging said second gear, and cam means intermediate said first and second gears and actuable upon rotation of said fine tuning sleeve to pivot said idler shaft and bring said first gear into engagement with the gear head of the adjacent one of said fine tuning screws for adjustment thereof, whereby fine tuning for each channel of the channel selector may be preset, and resilient means engaging said idler shaft and biasing said first gear out of engagement with the adjacent one of said fine tuning screws.

References Cited by the Examiner

UNITED STATES PATENTS 3,058,075 10/62 Polley -------------- 74—10.8 X

BROUGHTON G. DURHAM, *Primary Examiner.*

MILTON KAUFMAN, *Examiner.*